(12) United States Patent
Djordjevic et al.

(10) Patent No.: US 9,197,249 B2
(45) Date of Patent: Nov. 24, 2015

(54) ADAPTIVE LDPC-CODED MULTIDIMENSIONAL SPATIAL-MIMO MULTIBAND GENERALIZED OFDM

(71) Applicant: NEC Laboratories America, Inc., Princeton, NJ (US)

(72) Inventors: Ivan B. Djordjevic, Tucson, AZ (US); Ting Wang, West Windsor, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 229 days.

(21) Appl. No.: 13/911,326

(22) Filed: Jun. 6, 2013

(65) Prior Publication Data
US 2014/0101512 A1    Apr. 10, 2014

Related U.S. Application Data

(60) Provisional application No. 61/711,288, filed on Oct. 9, 2012.

(51) Int. Cl.
| | |
|---|---|
| *H03M 13/11* | (2006.01) |
| *H03M 13/27* | (2006.01) |
| *H03M 13/31* | (2006.01) |
| *H03M 13/35* | (2006.01) |

(52) U.S. Cl.
CPC ...... *H03M 13/1148* (2013.01); *H03M 13/1102* (2013.01); *H03M 13/2707* (2013.01); *H03M 13/31* (2013.01); *H03M 13/353* (2013.01)

(58) Field of Classification Search
CPC ............... H03M 13/1148; H03M 13/1102; H03M 13/353; H03M 13/31; H03M 13/2707

USPC ........................................ 714/758, 755, 786
See application file for complete search history.

(56) References Cited

U.S. PATENT DOCUMENTS

| | | | |
|---|---|---|---|
| 6,801,516 B1 * | 10/2004 | Lomp et al. ................... | 370/342 |
| 2005/0078615 A1 * | 4/2005 | Muri ............................. | 370/277 |
| 2006/0031701 A1 * | 2/2006 | Nam et al. ..................... | 713/500 |
| 2006/0193294 A1 * | 8/2006 | Jorswieck et al. ............ | 370/334 |

OTHER PUBLICATIONS

Chen, X., et al. "Reception of Dual-LP11-Mode CO-OFDM Signals Through Few-Mode Compatible Optical Add/Drop Multiplexer" Optical Fiber Communication Conference and Exposition (OFC/NFOEC), 2012 and the National Fiber Optic Engineers Conference. Mar. 2012. (3 Pages).

(Continued)

*Primary Examiner* — Guy Lamarre
(74) *Attorney, Agent, or Firm* — Joseph Kolodka

(57) ABSTRACT

Systems and methods of transmitting includes one or more low-density parity-check (LDPC) encoders configured to adaptively encode one or more streams of input data by adjusting error correction strength based upon channel conditions. One or more mappers are configured to map one or more encoded data streams to symbols by associating bits of the symbols to points of an optimum signal constellation design (OSCD) based on one or more encoded data streams, the OSCD being decomposed into two or more sub-constellations. A spectral multiplexer is configured to combine symbol streams for the one or more encoded data streams to provide a plurality of spectral band groups. A mode multiplexer is configured to combine spectral contents of the plurality of spectral band groups allocated to a plurality of spatial modes for transmission over a transmission medium.

15 Claims, 6 Drawing Sheets

(56) References Cited

OTHER PUBLICATIONS

Coleri, S., et al. "Channel Estimation Techniques Based on Pilot Arrangement in OFDM Systems" IEEE Transactions on Broadcasting, vol. 48, No. 3. Sep. 2002. pp. 223-229.

Cvijetic, M., et al. "Dynamic Multidimensional Optical Networking Based on Spatial and Spectral Processing" Optics Express, vol. 20, No. 8. Apr. 2012. (7 Pages).

Djordjevic, I., et al. "Spatial-Domain-Based Hybrid Multidimensional Coded-Modulation Schemes Enabling Multi-TB/S Optical Transport" Journal of Lightwave Technology, vol. 30, No. 14. Jul. 2012. pp. 2315-2328.

Djordjevic, I., et al. "Generalized OFDM (GOFDM) for Ultra-High-Speed Optical Transmission" Optics Express, vol. 19, No. 7. Mar. 2011. (11 Pages).

Ho, K., et al. "Statistics of Group Delays in Multimode Fiber With Strong Mode Coupling" Journal of Lightwave Technology, vol. 29. Apr. 2012. pp. 1-12.

Krummrich, P. "Optical Amplifiers for Multi Mode / Multi Core Transmission" Optical Fiber Communication Conference and Exposition (OFC/NFOEC), 2012 and the National Fiber Optic Engineers Conference. Mar. 2012. (3 Pages).

Liu, T., et al. "On the Optimum Signal Constellation Design for High-Speed Optical Transport Networks" Optics Express, vol. 20, No. 18. Aug. 2012. (11 Pages).

Ma, Y., et al. "1-TB/S Single-Channel Coherent Optical OFDM Transmission Over 600-KM SSMF Fiber With Subwavelength Bandwidth Access" Optics Express, vol. 17, No. 11. May 2009. (7 Pages).

Murshid, S., et al. "Multiplexing of Optical Channels as a Function of Orbital Angular Momentum of Photons" Frontiers in Optics, (FiO) 2008/Laser Science XXIV (LS) Conf. FiO/LS. Oct. 2008. (1 Page).

Randel, S., et al. "Mode-Multiplexed 6_20-GBD QPSK Transmission Over 1200-KM DGD-Compensated Few-Mode Fiber" Optical Fiber Communication Conference and Exposition (OFC/NFOEC), 2012 and the National Fiber Optic Engineers Conference. Mar. 2012. (3 Pages).

Sakaguchi, J., et al. "19-Core Fiber Transmission of 19X100X172-GB/S SDM-WDM-PDM-QPSK Signals at 305TB/S" Optical Fiber Communication Conference and Exposition (OFC/NFOEC), 2012 and the National Fiber Optic Engineers Conference. Mar. 2012. (3 Pages).

Shieh, W., et al. "107 GB/S Coherent Optical OFDM Transmission Over 1000-KM SSMF Fiber Using Orthogonal Band Multiplexing" Optics Express, vol. 16, No. 9. Apr. 2008. (9 Pages).

Sloane, N., et al. "Minimal-Energy Clusters of Hard Spheresminimal-Energy Clusters of Hard Spheres" Discrete and Computational Geometry, vol. 14, No. 1. Dec. 1995. pp. 237-259.

Tang, Y., et al. "Coherent Optical OFDM Transmission up to 1 TB/S per Channel" Journal of Lightwave Technology, vol. 27, No. 16. Aug. 2009. pp. 3511-3517.

Winzer, P., et al. "Beyond 100G Ethernet" IEEE Communications Magazine, vol. 48, No. 7. Jul. 2010. pp. 26-30.

Zou, D., et al. "LDPC-Coded Mode-Multiplexed CO-OFDM Over 1000 KM of Few-Mode Fiber" 2012 Conference on Lasers and Electro-Optics (CLEO). May 2012. (2 Pages).

Ryf, R., et al. "Space-Division Multiplexed Transmission Over 4200-KM 3-Core Microstructured Fiber" Optical Fiber Communication Conference and Exposition (OFC/NFOEC), 2012 and the National Fiber Optic Engineers Conference. Mar. 2012. (3 Pages).

Zongwang, L., et al. "Efficient Encoding of Quasi-Cyclic Low-Density Parity-Check Codes" Proceedings of the Global Telecommunications Conference, 2005. GLOBECOM '05. Nov. 2005. pp. 1205-1210.

\* cited by examiner

500

Adaptively encoding one or more streams of input data with one or more LDPC encoders
502

Adaptively encoding by adjusting error correction strength based upon channel conditions
504

Interleaving the encoded data stream
506

Mapping the encoded data stream to symbols by associating bits of the symbols to points of an OSCD constellation based on the encoded data stream
508

Decomposing the OSCD constellation into two or more sub-constellations
510

Spectrally multiplexing the symbols for the encoded data stream to provide a plurality of spectral band groups
512

Mode multiplexing the encoded data stream for the plurality of spectral band groups onto a transmission medium
514

FIG. 5

ADAPTIVE LDPC-CODED MULTIDIMENSIONAL SPATIAL-MIMO MULTIBAND GENERALIZED OFDM

RELATED APPLICATION INFORMATION

This application claims priority to provisional application Ser. No. 61/711,288 filed Oct. 9, 2012 and incorporated herein by reference in its entirety.

BACKGROUND

1. Technical Field

The present invention relates to signal processing, and more particularly, to adaptive low-density parity-check (LDPC) coded multidimensional spatial-MIMO multiband generalized orthogonal frequency-division multiplexing (GOFDM).

2. Description of the Related Art

In the recent years, with the rapid growth of data-centric services and the general deployment of broadband access networks, exponentially-increasing internet traffic has placed enormous transmission rate demand on the underlying information infrastructure at every level, from the core to access networks. Such transmission rate demand has pushed optical communication systems to a 100 Gb/s Ethernet (100 GbE) standard, with 400 GbE and 1 Tb/s Ethernet (1 TbE) under consideration. While there are technologies that may potentially be used to deliver optical TbE, there remain a number of practical implementation costs and complexity challenges. For example, polarization division multiplexed (PDM) quadrature amplitude modulation (QAM) requires huge QAM constellations to reach Tb/s-range with commercially available symbol rates. Moreover, the terabit optical Ethernet will be affected not only by limited bandwidth of information-infrastructure, but also by its energy consumption.

SUMMARY

A transmitter includes one or more low density parity check (LDPC) encoders configured to adaptively encode one or more streams of input data by adjusting error correction strength based upon channel conditions. One or more mappers are configured to map one or more encoded data streams to symbols by associating bits of the symbols to points of an optimum signal constellation design (OSCD) based on one or more encoded data streams, the OSCD being decomposed into two or more sub-constellations. A spectral multiplexer is configured to combine symbol streams for the one or more encoded data streams to provide a plurality of spectral band groups. A mode multiplexer is configured to combine spectral contents of the plurality of spectral band groups allocated to a plurality of spatial modes for transmission over a transmission medium.

A receiver includes a mode demultiplexer configured to demultiplex a received input signal into a plurality of data streams carried by different spatial modes. One or more generalized orthogonal frequency division multiplexing (GOFDM) receivers are configured to estimate and compensate mode coupling on the plurality of data streams. One or more a posteriori probability (APP) demappers are configured to determine symbol likelihoods and bit likelihoods for the plurality of data streams. One or more LDPC decoders are configured to decode the plurality of data streams using the bit likelihoods to reconstruct an original transmitted signal, the one or more LDPC decoders being adaptively reconfigured by matching a code rate of one or more encoders of a transmitter based upon channel conditions.

A method for transmitting includes adaptively encoding one or more streams of input data using one or more LDPC encoders by adjusting error correction strength based upon channel conditions. One or more encoded data streams are mapped to symbols by associating bits of the symbols to points of an optimum signal constellation design (OSCD) based on one or more encoded data streams, the OSCD being decomposed into two or more sub-constellations. Symbol streams for the one or more encoded data streams are combined to provide a plurality of spectral band groups. Spectral contents of the plurality of spectral band groups allocated to a plurality of spatial modes are combined for transmission over a transmission medium.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 5 shows a block/flow diagram illustratively depicting a system/method for transmitting data, in accordance with one embodiment.

DETAILED DESCRIPTION OF PREFERRED EMBODIMENTS

Figure 1:
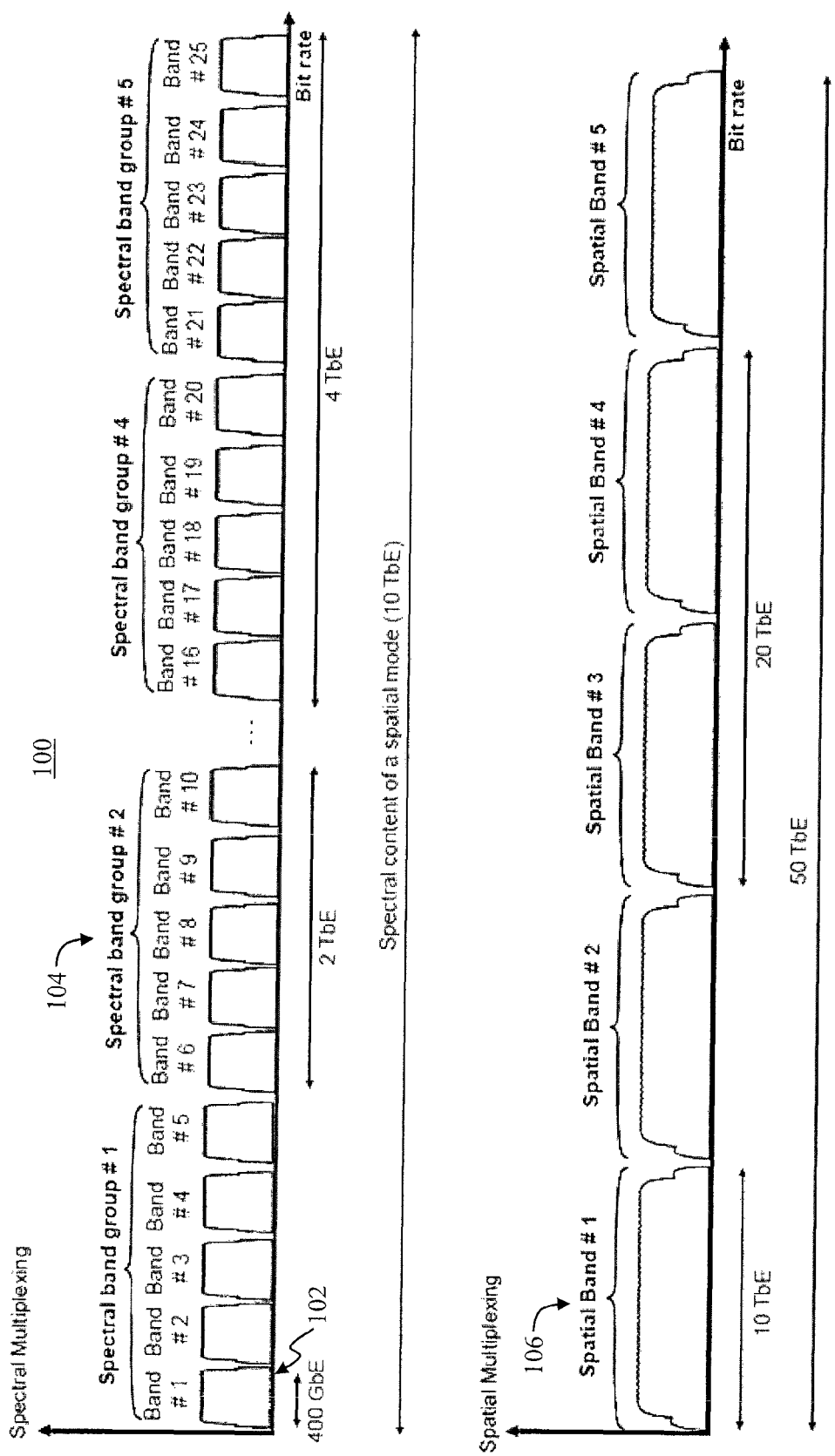
FIG. 1 shows an exemplary spectral-spatial orthogonal frequency division multiplexing frame, in accordance with one embodiment.

In accordance with the present principles, systems and methods are provided to enable ultra-high spectral efficiency (e.g., beyond 10 Tb/s) by employing an adaptive software-defined low-density parity-check (LDPC)-coded multiband generalized orthogonal frequency division multiplexing (GOFDM) scheme. Each spectral band group may receive one or more input source channels, which are adaptively encoded using one or more LDPC encoders by adjusting error correction strength based upon channel conditions. Adjusting error correction strength may include the partial reconfiguration of a corresponding parity-check matrix, which may include either changing the size of the block-submatrix of the corresponding parity-check matrix (i.e., H-matrix) or varying the number of employed block-rows while keeping codeword length intact.

The outputs of the LDPC encoders are forwarded to GOFDM transmitters, which may include a mapper configured to map the encoded data stream to symbols by associating bits of the symbols to points of an optimum signal constellation design (OSCD) based on the encoded data stream. The OSCD is preferably decomposed into two or more sub-constellations. For an OSCD of size M, sub-constellations have sizes $M_i$ (i=1, 2, ..., n) such that $M=M_1+M_2+\ldots+M_n$. Sub-constellations are formed using a next $m_i$ bits of the encoded data stream, such that $M_i=2^{m_i}$. The two or more sub-constellations preferably belong to the same parent OSCD. In this manner, corresponding coordinate points do not overlap in the presence of residual mode coupling, resulting in better tolerance to residual crosstalk.

Encoded data streams within each spectral band group are combined by spectral multiplexer. Each encoded data stream for each spectral band group are then combined by mode multiplexer and transmitted onto a transmission medium. Through GOFDM and mode/spatial-domain multiplexing, the present principles provide fine granularity and ultra-high spectral efficiency, enabling the future hybrid multidimensional adaptive software-defined optical transport.

Embodiments described herein may be entirely hardware, entirely software or including both hardware and software elements. In a preferred embodiment, the present invention is implemented in software, which includes but is not limited to firmware, resident software, field-programmable gate array (FPGA), ASIC, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable storage medium such as a semiconductor or solid state memory, magnetic tape, a removable computer diskette, a random access memory (RAM), a read-only memory (ROM), a rigid magnetic disk and an optical disk, etc.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Referring now to the drawings in which like numerals represent the same or similar elements and initially to FIG. 1, a spectral-spatial orthogonal frequency division multiplexing (OFDM) frame 100 is illustratively depicted in accordance with one embodiment. In OFDM systems, information is transmitted in frames by utilizing a number of parallel narrow band sub-carriers. The frame 100 is flexible and can support 50 Tb Ethernet (TbE) and beyond. The frame 100 may include, e.g., five spectral band groups 104 with center frequencies being orthogonal to each other. Each spectral component 102 carries 400 GbE, while each spectral band group 104 carries 2 TbE traffic.

A three-step hierarchical architecture may be employed based on spectral components 102 as building blocks having a, e.g., 400 Gb/s signal. The 400 Gb/s signal may originate from four 100 GbE channels, ten 40 GbE, one 400 GbE channel, etc. Other embodiments may also be employed. Also, several optical subcarriers of the all-optical OFDM scheme can be used to create a super channel structure.

The 400 GbE spectral slots are arranged into spectral band groups 104 to enable, e.g., 2 TbE as a first hierarchy. A second hierarchy may be provided by combining several spectral band groups to form a spatial band group 106. For example, by combining two spectral band groups, the scheme can enable 4 TbE. Preferably, five (or more or less) spectral band groups 104 are aligned along the optical spectrum as content of a spatial band 106. The second layer/hierarchy is related to spectral mode multiplexing, resulting in 10 Tb/s aggregate data rate per spatial band, corresponding to 10 TbE. A third hierarchy may be provided by combining spatial bands 106. In one example, two (or, e.g., four) spatial bands may be combined to provide 20 TbE (or, e.g., 40 TbE). In a preferred embodiment, the fiber link layer is implemented by combining the signals from spatial bands to achieve 50 TbE optical transmissions. In another example, by using 10 spatial bands, 100 TbE can be achieved as well.

It should be understood that while the frame 100 illustratively depicts one possible combination, other embodiments for providing a spectral-spatial arrangement are also contemplated. It is noted that about 25% of the line bit rate is assumed to be occupied by advanced forward error correction (FEC) schemes, such as low-density parity-check (LDPC) codes.

Figure 2:
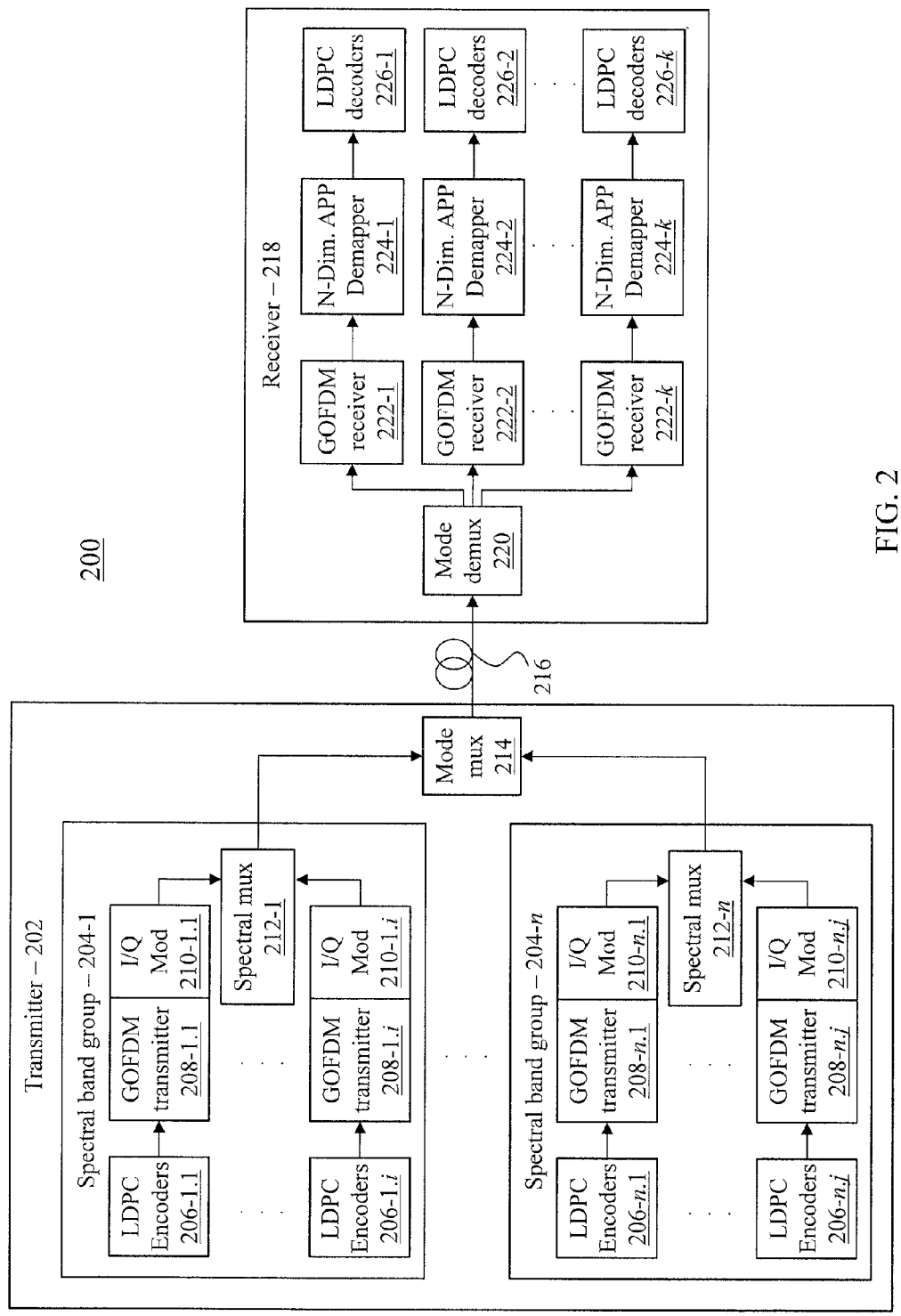
FIG. 2 shows a block/flow diagram illustratively depicting a high-level overview of an optical communications system/method, in accordance with one embodiment.

Referring now to FIG. 2, a block/flow diagram of a high-level overview of an optical communications system 200 is illustratively depicted in accordance with one embodiment. The optical communications system 200 combines adaptive software-defined LDPC-coding with spectral/mode-multiplexed multidimensional generalized OFDM (GOFDM). The adaptive LDPC-coding may be implemented in, e.g., ASIC, field-programmable gate array (FPGA), etc. The optical communications system 200 is shown with single polarization to facilitate discussion; however, it should be understood that both orthogonal polarization modes may also be employed. In the GOFDM scheme, the orthogonal subcarriers are considered as basis functions for multidimensional signaling. The hybrid degrees of freedom include amplitude, phase, frequency, polarization, spatial mode, etc.

The optical communications system 200 is shown including a transmitter 202 and a receiver 218. Although the transmitter 202 and the receiver 218 are both illustratively shown, one skilled in the art would appreciate that the transmitter 202 or receiver 218 may each be employed separately or in combination with each other in accordance with the present principles.

Transmitter 202 transmits information bits over an optical communications channel 216 to receiver 218 based on adaptive LDPC-coded GOFDM. Transmitter 202 combines the LDPC encoded GOFDM signal for each spectral band group 204-1-204-n to provide ultra-high-speed optical transport over the optical communications channel 216. The transmitter 202 encodes a plurality of data signals for each spectral band group 204 using adaptive LDPC encoders 206-1.1-206-n.j to protect against channel errors. Adaptive LDPC encoders 206-1.1-206-n.j may adjust error correct strength based on the conditions of the optical communications channel 216 by the partial reconfiguration of the corresponding parity-check matrix. In one embodiment, the set of binary LDPC encoders 206-n for each spectral band group 204 can be replaced by single nonbinary LDPC encoder per block.

The LDPC encoded signals are processed by GOFDM transmitters 208-1.1-208-n.j to generate LDPC encoded GOFDM signals. The LDPC encoded GOFDM signals include an in-phase (I) component and a quadrature (Q) component, which are modulated by electro-optical I/Q modulator 210-1.1-210-n.j to provide an analog optical waveform imposed on continuous wave (CW) laser signal. The independent LDPC encoded optical GOFDM signals are spectrally multiplexed by spectral mux 212-1-212-n to form spectral band groups. The GOFDM signals for each spectral band group 204 are then mode multiplexed by mode mux 214 into spatial band groups. The mode mux 214 is preferably spatial-MIMO (multiple input multiple output) based. The GOFDM super-carriers (containing multiple mutually orthogonal GOFDM bands) and GOFDM subcarrier (within a single GOFDM band) create a spectral component in the scheme of the present invention.

The super channel GOFDM signals are launched into the optical communications channel 216, which may include, e.g., few-mode fibers (FMF), few-core fibers (FCF), few-core-few-mode fibers (FCFMF), etc. The LDPC-coded GOFDM signal is received by receiver 218. Coherent detection of the mode demux 220 detects GOFDM signals after transmission in the channel 216. OFDM signals are received by the GOFDM receivers 222-1-222-k. The GOFDM receivers 222-1-222-k start with an adaptive optical bandpass filter to select the desired spectral band and perform the opposite operations to GOFDM transmitter 208. At the GOFDM receiver, distortion and coupling introduced in the optical communications channel 216 may be compensated for by, e.g., using training frames, pilot subcarriers, etc. After that, the symbol log-likelihood ratios (LLRs) are calculated in the N-dimensional a posteriori probability (APP) demappers 224-1-224-k, followed by bit LLRs calculations that are further passed to adaptive LDPC decoders 226. Preferably, there is one N-dimensional APP demapper 224 for each GOFDM receiver 222. Adaptive LDPC decoders 226-1-226-k calculate bit reliabilities to retrieve the original information bits, in addition to extrinsic information to be passed back to the APP demapper 224. The extrinsic information is iterated back and forth between APP demapper and LDPC decoders until a pre-determined number of iterations is reached.

Figure 3:
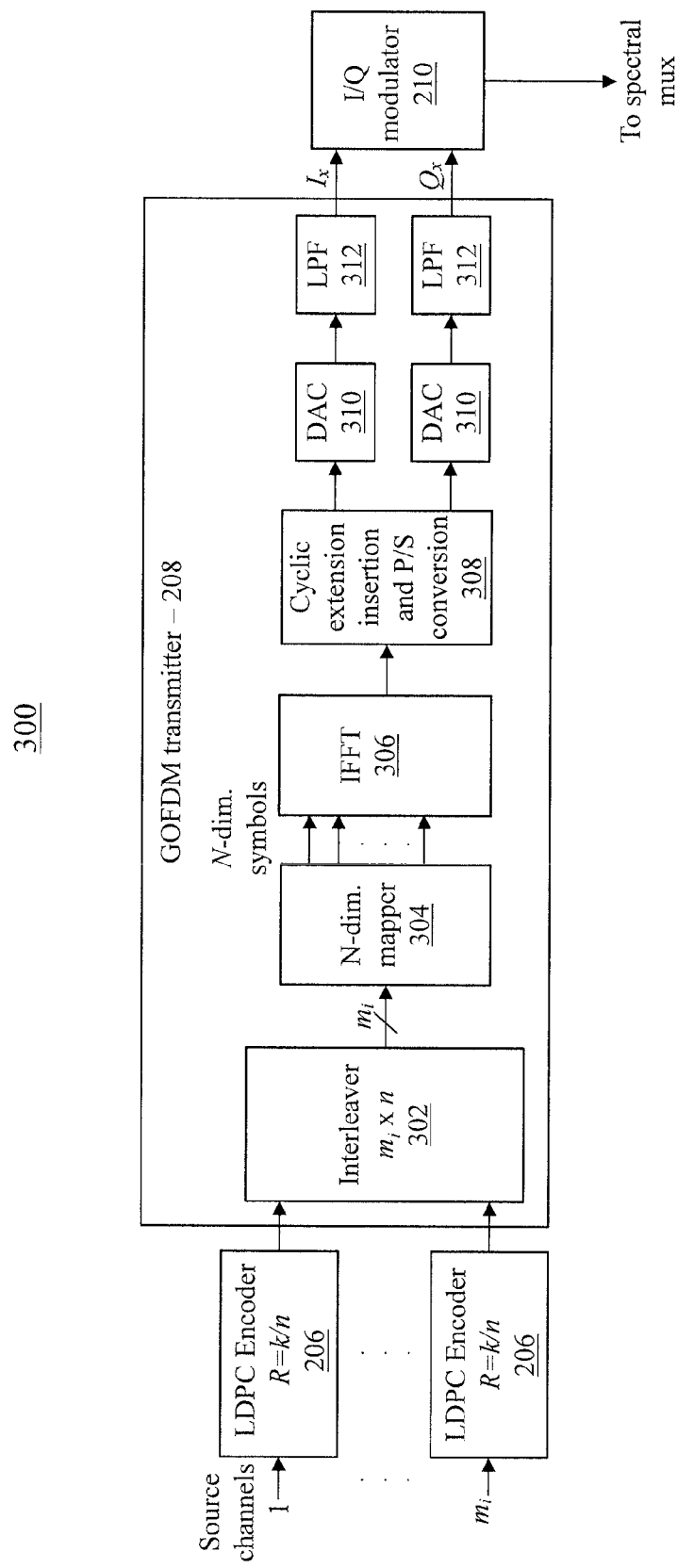
FIG. 3 shows a block/flow diagram illustratively depicting a detailed view of the transmitter, in accordance with one embodiment.

Referring now to FIG. 3, a block/flow diagram showing a detailed view of the GOFDM transmitter 208 is illustratively depicted in accordance with one embodiment. There are $m_i$ independent source channels for each spectral band group 204, where subscript i represents the i-th spectral group. To facilitate explanation, single polarization state is shown; however, both orthogonal polarization states are also contemplated. The $m_i$ independent data streams are encoded using parallel (n,k) LDPC encoders having k information bits and n coded bits with code rate R=n/k. The code rates in different branches could also be of different code rates, but of the same codeword length n. In one embodiment, the m binary LDPC encoders and block interleaver can be replaced by single nonbinary ($2^{m_i}$-ary) LDPC encoder.

In optically-routed networks, different lightwave paths can experience different penalties due to deployment of reconfigurable optical add-drop multiplexers (ROADMs) and wavelength cross-connects. As a result, the optical signal-to-noise ratios (OSNRs) can be different at the destination side. Adaptive LDPC encoders 206 may be configured to adjust error correction strength based on the conditions of the optical communication channel 216 by using the channel state information obtained from monitoring channels.

The code-rate adaption in quasi-cyclic LDPC code design can be performed by selecting a different number of block-rows in the corresponding parity-check matrix (H-matrix). Adaptive LDPC encoders 206 may perform code-rate adaption by partial reconfiguration of the decoder, which may include changing the size of the block-submatrix of the corresponding parity-check matrix (i.e., H-matrix) and/or varying the number of employed block-rows while keeping codeword length intact. Other implementations of code-rate adaption may also be employed.

The outputs of the adaptive LDPC encoders 206 are written row-wise into interleaver 302 and $m_i$ bits are taken column-wise from the interleaver 302. The output of the interleaver 302 drives the optimum signal constellation design (OSCD) N-dimensional mapper 304. The $m_i$ bits are preferably used to select the coordinates of corresponding N-dimensional OSCD constellation/sub-constellation of the mapper 304.

The OSCD signal constellation of size M is decomposed into sub-constellations of sizes $M_i$ (i=1, 2, ..., n) such that $M=M_1+\ldots+M_i$. The first incoming $m_i$ bits are used to select the points from $M_i=2^{m_i}$-ary sub-constellation. The purpose of the constellation decomposition is to provide more flexibility for adaptive modulation and coding. In one embodiment, the constellation points of sub-constellations corresponding to modes i (i=1, ..., n) belong to the same parent constellation so that the scheme is tolerant to imperfect mode-coupling compensation, in particular in the presence of fiber nonlinearities. To further improve flexibility, constellation sizes which are not power of two are preferably employed to allow for finer granulation of aggregate data rate. A similar strategy can be employed if center frequencies of bands are not perfectly orthogonal.

The coordinates of the N-dimensional constellation are used as inputs to inverse fast Fourier transform (IFFT) 306 to provide a time domain representation of the symbols. The output of IFFT 306 is processed by cyclic extension insertion and parallel to series (P/S) conversion 308. The in-phase (I) and quadrature (Q) components of 308 are used inputs into digital-to-analog converters (DACs) 310, followed by driver amplifiers (e.g., low-pass filters, LPFs) 312. The I and Q components of the LPFs 312 are I/Q modulated in block 210.

The aggregate data rate of the GOFDM scheme is given by $2(\Sigma_j m_j)RR_s N_1 N_2 N_3$, where the factor two indicates two polarizations, R denotes the code rate, $R_s$ denotes the symbol rate, $m_j$ denotes the number of bits per symbol in the j- the sub-constellation, $N_1$ denotes the number of bands within the spectral group, $N_2$ denotes the number of spectral groups, and $N_3$ denotes the number of spatial bands. In a preferred embodiment, simultaneous rate adaptation and signal constellation size selection is performed so that the product of number of bits per symbol×code rate is closest to the channel capacity.

In one example, the aggregate data rate of a transmitter using a 24-ary OSCD is $2(m_1+m_2)RR_s N_1 N_2 N_3=2\times(3+4)\times 0.8\times36$ GS/s$\times5\times5=50.4$ Tb/s, which is compatible with 50 TbE. In this example, the 24-ary OSCD is decomposed into an 8-ary sub-constellation and a 16-ary sub-constellation, such that the first three bits (i.e., $M_i=8=2^{m_i}$ where $m_i=3$) of the incoming sequence are used to select the point from the 8-ary sub-constellation while the next four bits (i.e., $M_i=16=2^{m_i}$ where $m_i=4$) are used to select the point from 16-ary sub-constellation. The corresponding constellation is illustratively depicted in FIG. 4.

Figure 4:
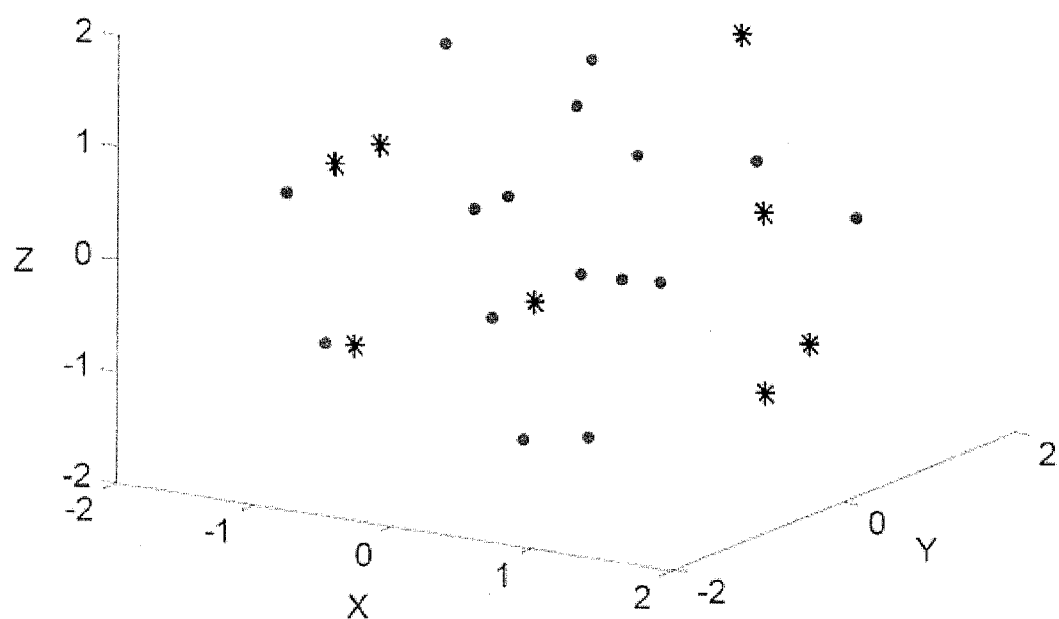
FIG. 4 shows an exemplary decomposition of a 24-ary constellation, in accordance with one embodiment.

Referring for a moment to FIG. 4, decomposition of a 24-ary OSCD constellation is illustratively depicted in accordance with one embodiment. The 8-ary sub-constellation (shown as asterisks) are transmitted over the x-polarization and the 16-ary sub-constellation (shown as dots) are transmitted over the y-polarization.

One advantage of the present principles, when used in polarization-multiplexing/mode-multiplexing, is to improve the tolerance to imperfectly compensated polarization-mode dispersion (PMD) or mode crosstalk. Namely, in a 24-ary OSCD constellation, the first sub-constellation is associated with a first polarization (spatial mode) and the second sub-constellation with a second polarization (spatial mode). With conventional PDM/MDM, the same constellations are typically used such that when PMD (mode crosstalk) is imperfectly compensated, the coordinates of corresponding constellation points overlap each other resulting in high sensitivity to residual crosstalk. On the other hand, the present principles decompose constellations into sub-constellations such that two points from different sub-constellations belong to the same original constellation and in the presence of residual crosstalk, the corresponding coordinates do not overlap, resulting in better tolerance.

The present invention significantly outperforms corresponding schemes based on conventional quadrature amplitude modulation (QAM), providing transmission rates beyond 10 Tb/s serial optical transport enabling technology.

Referring now to FIG. 5, a block/flow diagram showing a method for transmission is depicted in accordance with one illustrative embodiment. In block 502, one or more streams of input data are adaptively encoded with one or more LDPC encoders. To account for differing OSNR due to, e.g., ROADMs and wavelength cross-connects, in block 504, LDPC encoders may adjust error correction strength based upon channel conditions. Adjusting error correct strength preferably includes partial reconfiguration of a corresponding parity-check matrix (i.e., H-matrix). Partial reconfiguration of the corresponding parity-check matrix may include at least one of changing a size of a block-submatrix of the corresponding parity-check matrix and varying the number of employed block-rows while keeping codeword length intact.

In block 506, the LDPC encoded data stream is interleaved by writing the encoded data streams row-wise and reading column-wise from an interleaver. In block 508, the encoded data stream is mapped to symbols by associating bits of the symbols to points of an OSCD based on the encoded data stream. The OSCD is preferably decomposed into two or more sub-constellations in block 510. For an OSCD of size M, sub-constellations have size $M_i$ (i=1, . . . , n), such that $M=M_1+M_2+ \ldots +M_n$. $M_i$-ary sub-constellations are formed using a next $m_i$ bits of the encoded data stream, where $M_i=2^{m_i}$. For example, a 24-ary OSCD may be decomposed into 8-ary and 16-ary sub-constellations, such that the first 3 bits (i.e., $M_1=8=2^3$) of the encoded data stream are used to select points for the 8-ary sub-constellation and the next 4 bits (i.e., $M_2=16=2^4$) of the encoded data stream are used to select points for the 16-ary sub-constellation. Preferably, the two or more sub-constellations belong to a same parent constellation such that the corresponding coordinate points do not overlap resulting in better tolerance to residual crosstalk. The points of the OSCD are used by an IFFT block.

In block 512, the symbols for the encoded data stream are spectrally multiplexed to provide a plurality of spectral band groups. In block 514, the encoded data stream for the plurality of spectral band groups are combined by mode multiplexing onto a transmission medium. The transmission medium preferably includes an optical communications channel, which may include, e.g., FMF, FCF, FCFMF, etc.

Figure 6:
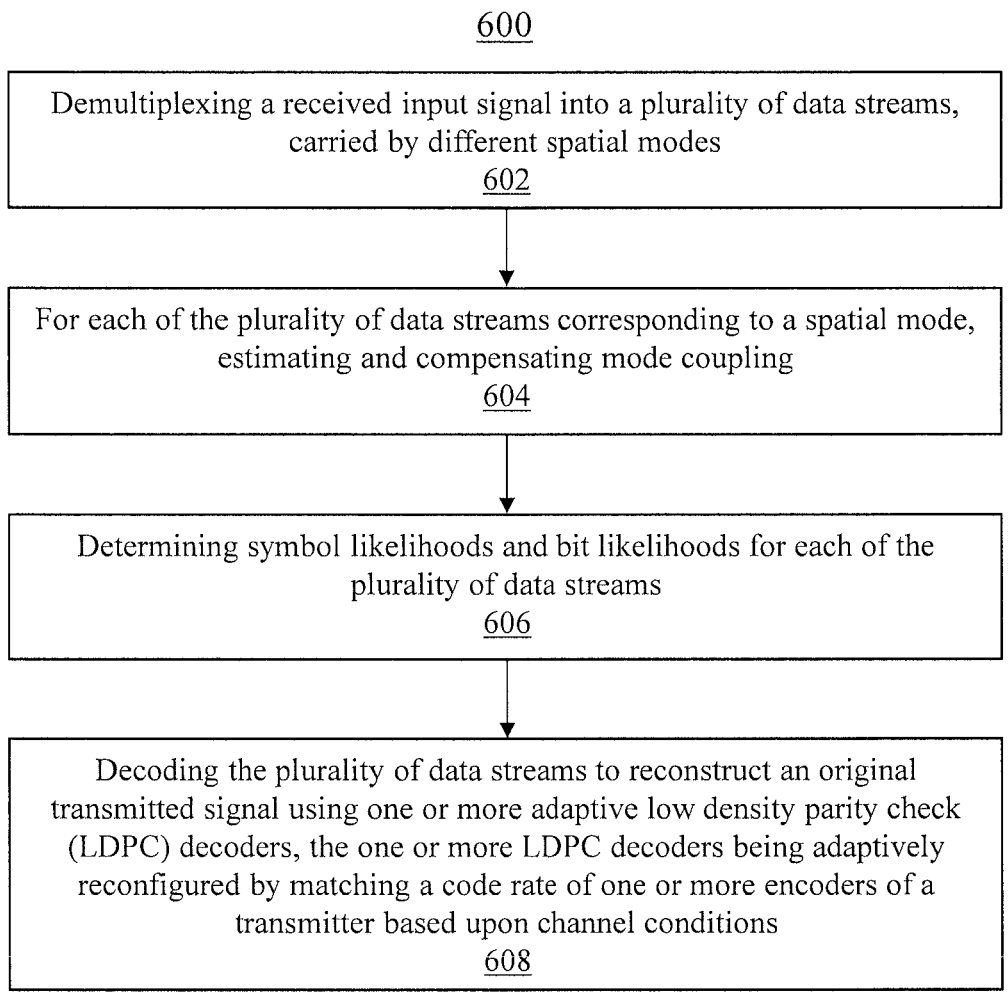
FIG. 6 shows a block/flow diagram illustratively depicting a system/method for receiving data, in accordance with one embodiment.

Referring now to FIG. 6, a block/flow diagram showing a method for receiving is illustratively depicted in accordance with one embodiment. In block 602, a demultiplexer receives an encoded input signal transmitted over a transmission medium, such as, e.g., an optical communications channel. The received input stream is demultiplexed into a plurality of data streams carried by different spatial modes. In block 604, one or more GOFDM receivers estimate and compensate mode coupling. Namely, for each of the plurality of data streams corresponding to a spatial mode, upon selection of a desired spatial band by an adaptive optical band-pass filter, and a balanced coherent detection, the GOFDM receiver performs the estimation and compensation of mode coupling. Estimation and compensation of mode coupling may include compensation of other dispersion effects (such as, e.g., chromatic dispersion). Compensation may include, e.g., using training frames, pilot subcarriers, etc. In block 606, the symbol likelihoods are calculated for each of the plurality of data streams, followed by bit likelihoods' calculation using one or more APP demappers. The bit likelihoods are passed to corresponding adaptive/reconfigurable LDPC decoders. In block 608, the plurality of data streams are decoded to reconstruct the original transmitted signal using one or more adaptive LDPC decoders, the one or more LDPC decoders being adaptively reconfigured by matching a code rate of one or more encoders of a transmitter based upon channel conditions. Adaptively decoding may include changing the size of the block-submatrix of the corresponding parity-check matrix (i.e., H-matrix) and/or varying the number of employed block-rows while keeping codeword length intact.

Having described preferred embodiments of a system and method of adaptive LDPC-coded multidimensional spatial-MIMO multiband generalized OFDM (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A transmitter, comprising:
   one or more low-density parity-check (LDPC) encoders configured to adaptively encode a stream of input data by adjusting error correction strength based upon channel conditions;
   one or more mappers configured to map the encoded data stream to symbol streams by associating bits of the symbol streams to points of an optimum signal constellation design (OSCD) based on the encoded data stream, the OSCD being decomposed into two or more sub-constellations;
   a spectral multiplexer configured to combine the symbol streams for the encoded data stream to provide a plurality of spectral band groups; and
   a mode multiplexer configured to combine spectral contents of the plurality of spectral band groups allocated to a plurality of spatial modes for transmission over a transmission medium.

2. The transmitter as recited in claim 1, wherein adjusting error correction strength includes partial reconfiguration of a parity-check matrix.

3. The transmitter as recited in claim 2, wherein partial reconfiguration of the parity-check matrix includes at least one of changing a size of a block-submatrix of the parity-check matrix and changing a number of employed block-rows in the parity-check matrix.

4. The transmitter as recited in claim 1, wherein the coordinates point to sub-constellations belonging to a same parent constellation.

5. The transmitter as recited in claim 1, wherein sizes of the two or more sub-constellations sum to a size of the OSCD constellation.

6. The transmitter as recited in claim 1, wherein points for each of the two or more sub-constellations $M_i$ are identified based on a next $m_i$ set of bits of the encoded data stream, wherein $M_i=2^{m_i}$.

7. The transmitter as recited in claim 1, wherein the transmission medium is an optical transmission medium.

8. A method for transmitting, comprising:
   adaptively encoding a streams of input data using one or more low-density parity-check (LDPC) encoders by adjusting error correction strength based upon channel conditions;
   mapping the encoded data streams to symbols streams, using one or more mappers, by associating bits of the symbols streams to points of an optimum signal constellation design (OSCD) based on the encoded data streams, the OSCD being decomposed into two or more sub-constellations;
   combining the symbol streams for the encoded data streams, using a spectral multiplexer, to provide a plurality of spectral band groups; and
   combining spectral contents of the plurality of spectral band groups allocated to a plurality of spatial modes, using a mode multiplexer, for transmission over a transmission medium.

9. The method as recited in claim 8, wherein adjusting error correction strength includes partial reconfiguration of a parity-check matrix.

10. The method as recited in claim 9, wherein partial reconfiguration of the parity-check matrix includes at least one of changing a size of a block-submatrix of the parity-check matrix and changing a number of employed block-rows in the parity-check matrix.

11. The method as recited in claim 8, wherein the coordinates point to sub-constellations belonging to a same parent constellation.

12. The method as recited in claim 8, wherein sizes of the two or more sub-constellations sum to a size of the OSCD.

13. The method as recited in claim 8, wherein points for each of the two or more sub-constellations $M_i$ are identified based on a next $m_i$ set of bits of the encoded data stream, wherein $M_i=2^{m_i}$.

14. The method as recited in claim 8, wherein the transmission medium is an optical transmission medium.

15. The method as recited in claim 8, further comprising:
   demultiplexing a received input signal into a plurality of data streams carried by different spatial modes;
   estimating and compensating mode coupling on the plurality of data streams using one or more generalized orthogonal frequency division multiplexing (GOFDM) receivers;
   determining symbol likelihoods and bit likelihoods for the plurality of data streams; and
   decoding the plurality of data streams to reconstruct an original transmitted signal using one or more LDPC decoders, the one or more LDPC decoders being adaptively reconfigured by matching a code rate of one or more encoders of a transmitter based upon channel conditions.

\* \* \* \* \*